United States Patent [19]
Thompson

[11] Patent Number: 5,922,396
[45] Date of Patent: Jul. 13, 1999

[54] ELECTRON TRANSPORTING AND LIGHT EMITTING LAYERS BASED ON ORGANIC FREE RADICALS

[75] Inventor: Mark E. Thompson, Anaheim, Calif.

[73] Assignee: The University of Southern California, Los Angeles, Calif.

[21] Appl. No.: 09/025,660

[22] Filed: Feb. 18, 1998

Related U.S. Application Data

[62] Division of application No. 08/774,120, Dec. 23, 1996, Pat. No. 5,811,833.

[51] Int. Cl.$^6$ ....................................................... B05D 5/06
[52] U.S. Cl. ............................ 427/69; 427/109; 427/162; 427/166; 427/255; 427/255.6; 427/70
[58] Field of Search ..................................... 427/162, 109, 427/69, 255.6, 255

[56] References Cited

U.S. PATENT DOCUMENTS

| | | | |
|---|---|---|---|
| 4,950,950 | 8/1990 | Perry et al. | 313/504 |
| 5,294,869 | 3/1994 | Tang et al. | 313/504 |
| 5,324,604 | 6/1994 | Bugner et al. | 430/58 |
| 5,554,220 | 9/1996 | Forrest et al. | 117/58 |

FOREIGN PATENT DOCUMENTS

WO96/19792  6/1996  WIPO.

OTHER PUBLICATIONS

S.R. Forrest, Burrows, Thompson, "Organic Emitters Promise a New Generation of Displays", Laser Focus World, Feb. 1995.
J. Kido, M. Kimura, K. Nagai, Multilayer White Light-–Emitting Organic Electroluminescent Device, Science vol. 267, 1332 (1995) (no mo).
A. Dodabalapur et al., "Microcavity Effects in Organic Semiconductors", Appl. Phys. Lett., vol. 64, 2486 (1994) (no mo).
M. Granstrom et al., "White Light Emission from a Polymer Blend Light Emitting Diode" Appl. Phys. Lett., vol. 68, 147 (1996).
B.O. Dabbousi et al., "Electroluminescence fron CdSe Quantum–dot/polymer Composites" Appl. Phys. Lett., vol. 66, 1316 (1995) (no mo).
V.L. Colvin et al., "Light–emitting Diodes Made From Cadmium Selenide Nanocrystals and a Semiconducting Polymer", Nature 370, 354 (1994) (no mo).
P.E. Burrows et al., "Electroluminescence from Trap–limited Current Transport in Vacuum Deposited Organic Light Emitting Devices" Applied Phys. Lett., vol. 64, 2285 (1994) (no mo).
C. Adachi et al., "Blue Light Emitting Organic Electroluminescent Devices" Applied Phys. Lett., vol. 56 799–801 (1990) (no mo).
M.J. Heeg et al., "Decaphenylgermanocene, –Stannocene and –Plumbocene, . . . " J. Organometallic Chem., vol. 346, 321–332 (1988) (no mo).

*Primary Examiner*—Janyce Bell
*Attorney, Agent, or Firm*—Kenyon & Kenyon

[57] ABSTRACT

Electron transporting layers comprised of organic free radicals are disclosed for use as the electron transporting layer in multi-layer structures that are useful for fabricating organic light emitting devices (OLEDs). For example, the multi-layer structure may include an electron transporting layer containing an organic free radical comprised of a multi-aryl-substituted cyclopentadienyl free radical of formula (I):

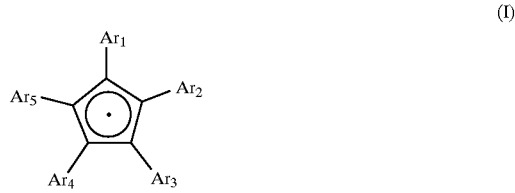

(I)

wherein $Ar_1$, $Ar_2$, $Ar_3$, $Ar_4$ and $Ar_5$ each are, independently of the other hydrogen, an alkyl group or an unsubstituted or substituted aromatic group. More specifically, included among these materials are those which are comprised of an electron transporting material based on, the pentaphenylcyclopentadienyl $Cp^{\Phi \cdot}$ free radical:

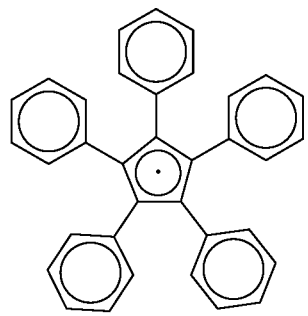

6 Claims, 1 Drawing Sheet

ELECTRON TRANSPORTING AND LIGHT EMITTING LAYERS BASED ON ORGANIC FREE RADICALS

This application is a division of prior application Ser. No. 08/774,120, filed Dec. 23,1996, now U.S. Pat. No. 5,811,833.

FIELD OF INVENTION

This invention relates to organic light emitting devices ("OLEDs") and more particularly to electron transporting materials and methods of making the same for use in the electron transporting layer of OLEDs.

BACKGROUND OF THE INVENTION

Organic light emitting devices have been shown to have sufficient brightness, range of color and operating lifetimes for use as a practical alternative technology to LCD-based full color flat-panel displays (S. R. Forrest, P. E. Burrows and M. E. Thompson, Laser Focus World, February 1995). Furthermore, since many of the organic thin films used in such devices are transparent in the visible spectral region, they potentially allow for the realization of a completely new type of display pixel in which the red (R), green (G), and blue (B) emission layers are placed in a vertically stacked geometry to provide a simple fabrication process, minimum R-G-B pixel size, and maximum fill factor.

It is believed herein that ideas which have been disclosed for using separate, side-by-side R, G, B OLEDs to make a full color display (C. W. Tang et al, U.S. Pat. No. 5,294,869 (1994)) have not been realized in a practical device.

Such schemes suffer from a complex layer structure, and lack of known methods for damage-free, post-deposition, patterning of organic layers at the resolution required for color displays. Others have suggested using an array of white OLEDs (J. Kido, M. Kimura, K. Nagai, Science, vol. 267, 1332 (1995)) backed by side-by-side R, G and B color filters deposited and patterned prior to OLED fabrication. However, such a design sacrifices at least 66% of the light from each white OLED, with the remainder being absorbed in the filter generating heat. Such a design suffers, therefore, from low efficiency and accelerated degradation. Alternative schemes based on microcavity filtering of a broad OLED spectrum (A. Dodabalapur, L. J. Rothberg, T. M. Miller and E. W. Kwock, Appl. Phys. Lett., vol. 64, 2486 (1994)) suffer from complex and expensive substrate patterning requirements and directionality of the resulting color.

Published examples of tunable OLEDs utilize a blend of either two polymers (M. Granstrom and O. Inganäs, Appl. Phys. Lett., vol. 68, 147 (1996)) or a polymer doped with semiconductor nanocrystallites (B. O. Dabbousi, M. G. Bawendi, O. Onitsuka and M. F. Rubner, Appl. Phys. Lett., vol. 66, 1316 (1995); V. L. Colvin, M. C. Schlamp, A. P. Allvisatos, Nature 370, 354 (1994)). Each component of the blend emits radiation having a different spectral energy distribution. The color is tuned by varying the applied voltage. A higher voltage results in more emission from the higher bandgap polymer, which emits radiation toward the blue region of the spectrum, while also resulting in higher overall brightness due to increased current injection into the device. Although tuning from orange to white has been demonstrated, incomplete quenching of the low-energy spectral emission appears to prohibit tuning completely into the blue. In addition, emission intensity can only be controlled by using pulsed current and reduced duty cycles. In a color display, therefore, prohibitively high drive voltages and very low duty cycles may be necessary for blue pixels. This necessitates a complex driver circuit, renders passive matrix operation extremely difficult, if not impossible, and is likely to accelerate degradation of the display.

A transparent organic light emitting device (TOLED) which represents a first step toward realizing high resolution, independently addressable stacked R-G-B pixels has been reported recently in International Patent Application No. PCT/US95/15790 which corresponds to co-pending U.S. Ser. No. 08/354,674. This TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg—Ag-ITO layer for electron-injection. A device was disclosed in which the Mg—Ag-ITO electrode was used as a hole-injecting contact for a second, different color-emitting OLED stacked on top of the TOLED. Each device in the stack (SOLED) was independently addressable and emitted its own characteristic color through the transparent organic layers, the transparent contacts and the glass substrate, allowing the entire device area to emit any combination of color that could be produced by varying the relative output of the two color-emitting layers. Thus, for the specific device disclosed in PCT/US95/15790, which included a red-emitting layer and a blue-emitting layer, the color output produced by the pixel could be varied in color from deep red through blue.

It is believed that publication of PCT/US95/15790 provided the first disclosure of an integrated OLED where both intensity and color could be independently varied by using external current sources. As such, PCT/US95/15790 represents the first proof-of principle for achieving integrated, full color pixels which provide the highest possible image resolution, which is due to the compact pixel size, and low cost fabrication which is due to the elimination of the need for side-by-side growth of the different color-producing pixels.

In building OLEDs, several different layers are typically used which have very different physical properties so that the charge carriers (holes and electrons) can be trapped in the organic material and then recombine there, leading to exciton formation and light emission. Although a large number of different materials have been identified that function as hole transporters, relatively few electron transporting materials have been reported. It would be desirable if a larger number of improved electron transporting materials were available that could be used in OLEDs. In particular, it would be desirable to have electron transporting materials having improved carrier mobility and carrier density and which can be readily prepared from air stable precursors. It would be further desirable to have electron transporting materials that are selected from a family of compounds that can also serve as emissive materials having a spectral emission that can be adjusted for use in an OLED.

ADVANTAGES AND SUMMARY OF THE INVENTION

The subject invention is directed to electron transporting materials suitable for use in OLEDs wherein the electron transporting material is comprised of an organic free radical. As a representative embodiment of the subject invention, the organic free radical comprises a multi-aryl-substituted cyclopentadienyl free radical, $Cp^{Ar\cdot}$, of formula (I):

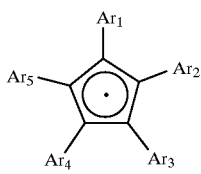

(I)

wherein $Ar_1$, $Ar_2$, $Ar_3$, $Ar_4$ and $Ar_5$ each are, independently of the other Ar-groups, hydrogen, an alkyl group or an unsubstituted or substituted aromatic group.

More specifically, the subject invention is directed to an electron transporting material based on the pentaphenylcyclopentadienyl $Cp^{\Phi\cdot}$ free radical:

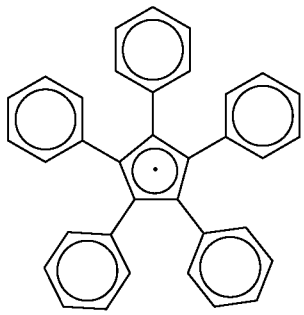

(II)

The electron transporting material of the subject invention has the feature that an electron transporting layer can be prepared from an air-stable molecular precursor. Furthermore, the electron transporting layer can be prepared in vacuo from air stable precursor metallocene complexes. Still more specifically, in a representative embodiment of the subject invention, the electron transporting layers of the subject invention may be prepared from a Ge or Pb metallocene complex of $Cp^{\Phi\cdot}$.

A still further feature of the election transporting material of the subject invention is that the $Cp^{\Phi\cdot}$ complex may be readily reduced to the anion, giving the cyclopentadienyl ring aromatic character such that electron transfer from a cyclopentadienyl anion to an adjacent radical species is facilitated by overlap of the π-orbitals of the phenyl groups of adjacent molecules. Thus, since the $Cp^{\Phi\cdot}$ complex can be readily reduced to the anion, the electron transporting material of the subject invention may be used to provide a good path for carrier transport through the material, resulting in an electron transporting layer (ETL) having especially beneficial properties, specifically including improved carrier mobility and carrier density, as compared to prior art materials.

Still another feature of the subject invention is that the electron emitting material may be selected from a family of chemical compounds that may also function as emissive materials, thus permitting the material to function in the dual role of an electron transporting material and of an emissive material. Yet a further feature of the subject invention is that the chemical compound may be selected by adjusting the substituents in a manner such that the spectral emission has a color having a desired set of color coordinates as characterized, for example, by using the X-Y chromaticity coordinates of the CIE calorimetric system.

In summary, the subject invention is directed, in a preferred embodiment, to an electron transporting layer that is included in a multi-layer structure having use as an electroluminescent device, wherein the electron transporting layer is comprised of an organic free radical and wherein the electron transporting layer is in electrical contact with a hole transporting layer. More specifically, the electron transporting layer is in direct physical contact with the hole transporting layer or is separated from the hole transporting layer by a layer containing an emissive material.

Further objectives and advantages of the subject invention will be apparent to those skilled in the art from the detailed description of the disclosed invention.

DETAILED DESCRIPTION OF THE PREFERRED EMBODIMENTS

Figure 1:
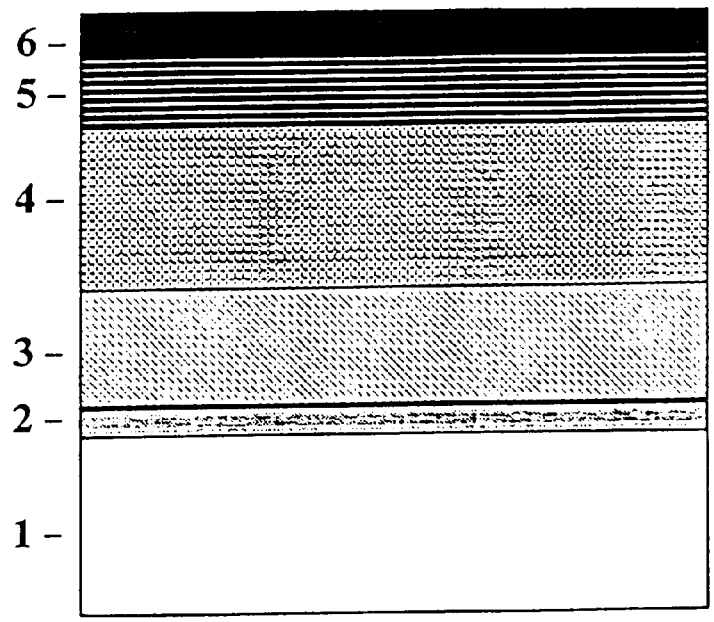
FIG. 1 shows the side view of a representative single heterostructure incorporating an electron transporting material that may also serve as an emissive material.

The subject invention will now be described in detail for specific preferred embodiments of the invention, it being understood that these embodiments are intended only as illustrative examples and the invention is not to be limited thereto.

The electron transporting material of the subject invention is comprised of an organic free radical which may be readily prepared in a manner that is suitable for fabricating the electron transport layer of an OLED. In a representative embodiment of the subject invention, the electron transporting material is represented by the chemical structure, $Cp^{Ar\cdot}$, of formula (I):

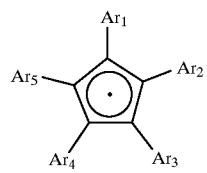

(I)

which is herein referred to as multi-aryl-substituted cyclopentadienyl free radical, wherein each Ar-group, $Ar_1$, $Ar_2$, $Ar_3$, $Ar_4$ and $Ar_5$, is hydrogen, an alkyl group or an unsubstituted or substituted aromatic group. Although the term "Ar-group" may typically be used to refer only to aryl groups, the term is used herein to include hydrogen or an alkyl group even though, preferably, at most only one of the Ar-groups is an alkyl group or hydrogen, with the remainder being the aromatic groups, and, most preferably, all of the Ar-groups are the aromatic groups. The aromatic groups may be independently selected to be the same or different, one from the other, with the total number of compounds that may be embraced by formula I being limited only insofar as they may be suitable for use in preparing an electron transporting layer and insofar as it is chemically practical to prepare such compounds. An organic free radical compound is herein defined to be suitable for use as an electron transporting material only if the carrier mobility of the electron transporting layer has a value of at least $10^{-6}$ cm$^2$/V sec.

The unsubstituted or substituted aromatic groups may be, for example, phenyl groups; groups having fused phenyl rings, such as naphthyl; or aromatic heterocyclic groups such as pyridyl or thiophenyl.

Each aromatic group may be, independently of the other aromatic groups, unsubstituted or substituted with one or more substituent groups. The substituent group, or groups, may be an electron donor group, an electron acceptor group or an alkyl group.

For those compounds which function not only as an election transporting material but also serve as an emissive material, the unsubstituted or substituted aromatic group may be selected so as to adjust the spectral emission characteristics in a manner such as to produce a desired color, as characterized, for example, by using the X-Y chromaticity coordinates of the CIE calorimetric system. For example, it is known that substantial changes in the emission spectra of a phenyl-containing compound may be produced dependent on whether the phenyl group is unsubstituted or is instead substituted in the orth or para position with an electron donor group or an electron acceptor group. In addition to being selected to adjust the emission characteristics, the donor and acceptor groups may also be selected to affect the degree of intermolecular interaction and, thus, carrier mobility. Moreover, such substituents may also be selected so as to adjust the reduction potential of the organic free radicals, that is, the energy required to reduce the free radicals, thus converting the free radicals to the anions of the free radical. By suitably selecting the substituents to produce a readily accessible reduction potential, the carrier mobility and/or the carrier trap depth may be favorably altered, such that stable organic free radicals may be produced which have an overall combination of electron-transporting and electron-emissive properties that is particularly suitable for use as an electron transporting layer.

The carrier mobility and carrier density of the heterostructure may be determined by measuring the I–V characteristics, for example, as described in P. E. Burrows et al, Applied Phys. Lett., vol. 64, 2285 (1994).

Still more specifically, in a preferred embodiment of the subject invention, the organic free radical is a pentaphenyl-cyclopentadienyl radical, $Cp^{\Phi \cdot}$ of formula (II):

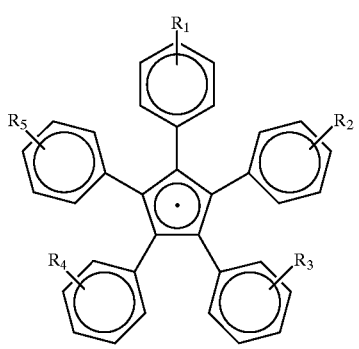

(II)

wherein each aryl group of formula (I) is defined in formula (II) as being a single phenyl group that may be unsubstituted, or substituted with the substituents $R_1, R_2, R_3, R_4$ and $R_5$, respectively, wherein each R-group represents independently from the other R-groups, one or more of an electron donor group, an electron acceptor group or an alkyl group.

As a specific illustrative embodiment of the subject invention, the organic free radical may be the unsubstituted $Cp^{\Phi \cdot}$, as represented by formula (III):

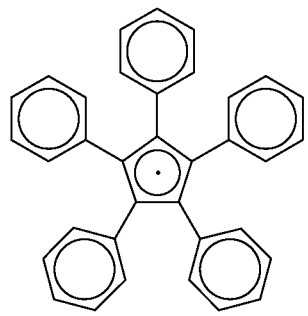

(III)

As still another specific illustrative embodiment of the subject invention, the organic free radical may be the tetraphenylcyclopentadienyl free radical of formula (IV),

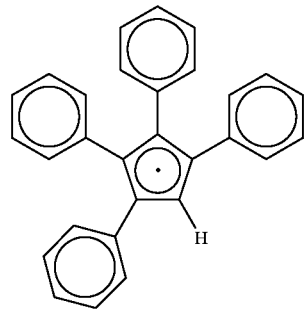

(IV)

and further-substituted variations thereof, for example, wherein the hydrogen shown in formula (IV) may be replaced by an alkyl group.

While not intending to be limited by the theory of the invention for the representative embodiments of the specific organic free radicals as disclosed herein, it is believed that the effectiveness of the $Cp^{Ar \cdot}$ free radical as an electron transporting material in the ETL of an OLED may be based on a combination of properties. These include the presence of a sterically shielded central cyclopentadienyl ring, which can form an unusually stable organic free radical because of the substantially complete steric shielding of the cyclopentadienyl ring; the ability of the cyclopentadienyl free radical to readily form an anion, which acting together with the free radical, serves as an electron transport carrier; and the strong aromatic character of the cyclopentadienyl anion, which results in strong overlap of the π-orbitals of the anion with the π-orbitals of the phenyl substituents, thus enhancing the election mobility that promotes effectiveness of the material as an electron carrier. The subject invention has the further feature that the substituents that are included in the organic free radicals may be selected so as to alter the emissive spectra and the reduction potential of the free radical in a manner so as to produce an overall combination of electron-transporting and electron-emissive properties that is particularly suitable for use as an electron transporting layer.

The subject invention is thus directed to electron transport materials suitable for use in the electron transport layer of an OLED, wherein the electron transport material is comprised of a stable organic free radical having a readily accessible reduction potential between the stable organic free radical and the anion formed from the radical, for example, the pentaphenylcyclopentadienyl free radical, $Cp^{\Phi \cdot}$, of formula (III) and the pentaphenylcyclopentadienyl anion of formula (V):

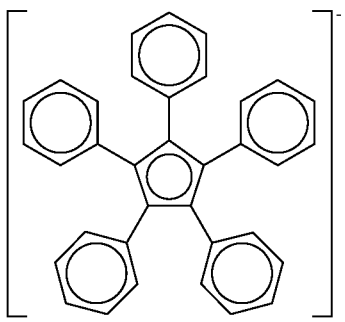

(V)

A ready accessible reduction potential leads to suitable electron conduction through the electron transporting layer, wherein suitable electron conduction is herein defined to mean an electron conduction based on having an electron mobility of at least about $10^{-6}$ cm$^2$/V sec.

Figure 2:
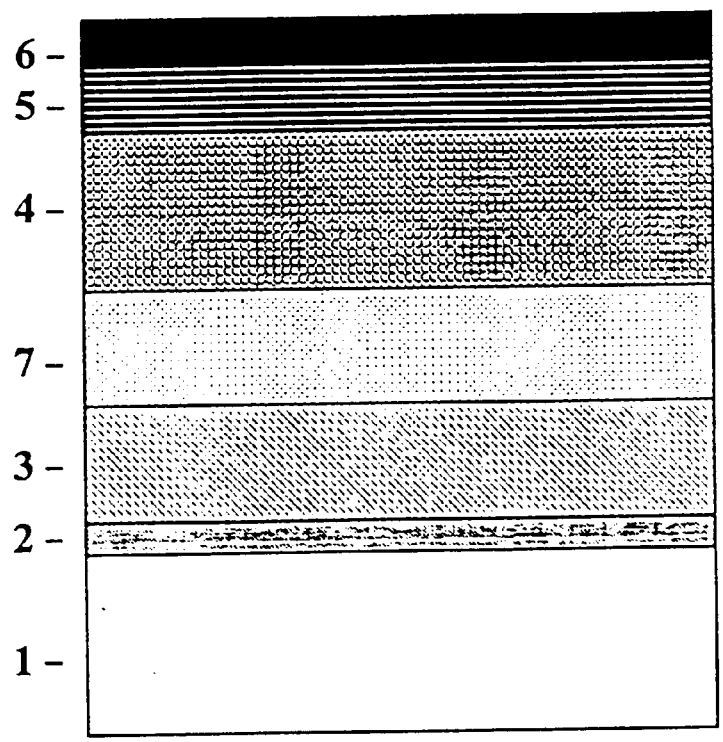
FIG. 2 shows the side view of a representative double heterostructure incorporating an electron transporting layer together with an additional layer which includes an emissive material.

An electron transporting layer comprised of the Cp$^{\Phi\cdot}$ free radical provides a further advantage in that the electron transporting material may, in some cases, also function as an emissive material in the OLED. Whenever the electron transporting material also serves as an emissive material, the OLED may be fabricated using a single heterostructure, such as shown in FIG. 1. If the electron transporting material does not also serve as an emissive material, the OLED may be fabricated from a double heterostructure, such as shown in FIG. 2.

The subject invention is directed toward a novel method for preparing the Cp$^{\Phi\cdot}$ free radical in bulk form as a thin layer of electron transporting material having a high electron mobility and a high electron carrier density, wherein the electron transporting layer is included in a multi-layer structure. It is believed that no prior art electron transporting materials have been disclosed which are comprised of an organic free radical. Thus, while the subject invention is directed toward use of a multi-aryl-substituted cyclopentadienyl free radical, or more specifically, a multi-phenyl-substituted cyclopentadienyl free radical, or still more specifically, a pentaphenylcyclopentadieyl free radical as a species representing the preferred embodiment, it is to be understood that the subject invention is generally directed toward any organic free radical that may be contained in an electron transporting layer as an electron transporting material having an electron mobility of at least $10^{-6}$ cm$^2$/V sec.

In addition to being a free radical, the Cp$^{\Phi\cdot}$ free radical differs from the pentaphenylcyclopentadiene itself, Cp$^{\Phi}$H:

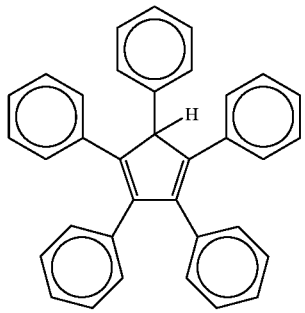

in that Cp$^{\Phi}$H has been reported to be a blue emitting material when used in OLEDs, C. Adachi et al., Appl. Phys. Lett., vol. 56, 799–801 (1990), whereas a film of the pentaphenylcyclopentadienyl free radical has been observed and reported to have a purple color, M. J. Heeg et al., J. Organometallic Chem., vol. 346, 321–332 (1988).

Furthermore, the Cp$^{\Phi\cdot}$ free radical differs from Cp$^{\Phi}$H in that the latter is not readily reduced. Reduction of Cp$^{\Phi}$H would have to be followed by loss of H+ to give the stable anionic form, which is not energetically feasible. In particular, whereas there is no reason to expect, based on these differences, that Cp$^{\Phi}$H would have good carrier transport properties at all, the Cp$^{\Phi\cdot}$ free radical is capable of being especially well suited for this purpose.

Another feature of the subject invention is based on the fact that, while it is typically difficult to prepare and store Cp$^{\Phi\cdot}$ by conventional methods, the Cp$^{\Phi\cdot}$ free radical material of the subject invention may be readily prepared in vacuo from air-stable precursor complexes. The metallocene complexes of pentaphenylcyclopentadiene, such as (Cp$^{\Phi}$)$_2$M, where M=Fe, Ru, Sn, Ge or Pb, may be prepared as disclosed in Heeg et al. These materials can be prepared from the metal salts and the Cp$^{\Phi}$anion, [Cp$^{\Phi}$]$^-$,

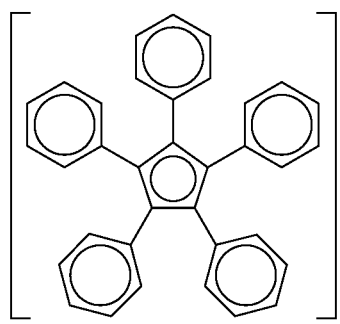

as illustrated by the following equation:

$$MX_2 + 2Cp^{\Phi}Li \rightarrow (Cp^{\Phi})_2M + 2LiX, \quad (1)$$

where M=Fe, Ru, Sn, Ge or Pb; and X=halide or acetate. Each of these complexes are air stable complexes. However, the Ge and Pb complexes are not thermally stable. Attempted sublimation of the Ge and Pb complexes at 250° C. and about $10^{-4}$ torr was reported to lead to formation of a metal mirror and sublimation of the gaseous Cp$^{\Phi\cdot}$ free radical species, as shown by the following equation:

$$(Cp^{\Phi})_2M' \xrightarrow[10^{-4} \text{ torr}]{250 \,°C.} M'(\text{solid}) + 2(\text{gas phase}) \quad (2)$$

The purple films which are deposited from the gas phase organic free radical, Cp$^{\Phi\cdot}$, are comprised only of the Cp$^{\Phi\cdot}$ free radical material, according to Heeg et al.

The subject invention is directed toward using such precursor materials and such methods to prepare electron transporting layers that may be used in substantially any type of multi-layer structure that includes an electron transporting layer. In particular, the free-radical-containing, electron transporting layer may be included, for example, in the multi-layer structure of a light emitting device. Such structures typically contain hole transporting layers, which may be in direct physical contact with the electron transporting layer, or alternatively, the hole transporting layer may be in direct physical contact with a layer of emissive material, which is in direct physical contact with the electron transporting layer. The layer of emissive material may be referred to as a luminescent layer.

The hole transporting layer is comprised of a material that is typically described as providing electrical conduction, when a voltage is applied, preferentially by the conduction of holes, as distinct from the electron transporting layer that provides electrical conduction preferentially by the conduction of electrons. The subject invention is, thus, directed to incorporating the subject electron transporting layer s into multi-layer structures wherein the electron transporting layer is in electrical contact with a hole transporting layer.

The stable organic free-radical-containing materials are intended to provide benefits and advantages that are uniquely suited for use as an electron transporting material, when such free-radical-containing materials are incorporated into a multi-layer structure as the electron transporting layer. While it is intended, in the more preferred embodiments of the subject invention, that the electron transporting layer be comprised predominantly of an organic free radical, or even, in some cases, be directed to electron transporting layers consisting essentially of organic free radicals, it is also contemplated that layers containing free radical materials that have undergone dimerization, even substantial dimerization, may also serve as effective electron transporting materials, and are, therefore, also contemplated to fall within the scope of the subject invention.

In fact, while it is preferred that the electron transporting layer be comprised predominantly, if not completely, of an organic free radical material, the subject invention is intended to embrace any electron transporting layer that includes an organic free radical material for which it can be shown that the presence of the organic free radical contributes to the electron-transporting characteristics of the electron transporting layer. For example, the layer may be comprised of organic free radical materials that are embedded in a matrix of non-free-radical, but still electron-transporting, material. An electron transporting layer comprised predominantly of an organic free radical is herein defined as a layer in which the organic free radical is the major component of the electron transporting layer.

In the preferred embodiments of the subject invention, the Ge (decaphenylgermanocene) or Pb (decaphenylplumbocene) complex of pentaphenylcyclopentadienyl is used as the source for preparing the thin layers of $Cp^{\Phi \cdot}$ in a vacuum deposition system.

As illustrative embodiments of the subject invention, the subject electron transporting materials may be incorporated into a single heterostructure as schematically illustrated in FIG. 1 or in a double heterostructure as schematically shown in FIG. 2. The materials, methods and apparatus for preparing the single and double heterostructures are disclosed, for example, in U.S. Pat. No. 5,554,220, which is herein incorporated in its entirety by reference. These structures are intended solely as examples showing how a multi-layer structure embodying the subject invention may be fabricated without in any way intending the invention to be limited to the particular sequence or order of making the layers shown. For example, FIG. 1 shows a multi-layer structure for which the sequence of layers, which are in direct physical contact, includes a substrate 1, which is preferably transparent, for example, glass or plastic; a first electrode, which may typically be an indium tin oxide (ITO) anode layer 2; a hole transporting layer 3; an electron transporting layer 4; a second electrode layer 5, for example, a metal cathode layer of Mg:Ag; and a metal protective layer 6, for example, made of a layer of Ag, for protecting the Mg:Ag cathode layer from atmospheric oxidation. FIG. 2 shows an additional layer 7, which includes an emissive material.

Although not limited to the thickness ranges recited herein, the ITO anode layer may be about 1000 Å to greater than about 4000 Å thick; the hole transporting layer about 50 Å to greater than about 1000 Å thick; the layer containing emissive material, layer 7, about 50 Å to about 200 Å thick; the electron transporting layer about 50 Å to about 1000 Å thick; and each metal layer, layers 5 and 6, about 50 Å to greater than about 100 Å thick, or substantially thicker if the cathode layer is not intended to be transparent.

The electron transporting layers comprised of organic free radicals may be included in substantially any type of multi-layer structure containing an electron transporting layer, for example, in multi-layer structures that are used to make an electroluminescent device, which is then incorporated into another device, such as a light emitting display device that is then incorporated into a larger display, a vehicle, a computer, a television, a printer, a large area wall, theater or stadium screen, a billboard or a sign.

This invention will now be described in detail with respect to showing how certain specific representative embodiments thereof will be made, the materials, apparatus and process steps being understood as examples that are intended to be illustrative only. In particular, the invention is not intended to be limited to the methods, materials, conditions, process parameters, apparatus and the like specifically recited herein.

EXAMPLES

Example 1

The transparent substrate 1 of FIG. 1, which, for example, may be glass or plastic, is pre-coated with an indium tin oxide (ITO) layer 2 having a sheet resistance of about 15 Ω/square. The substrate may be ultrasonically cleaned in detergent, followed by thorough rinsing in deionized water, 1,1,1-trichloroethane, acetone and methanol, and dried in pure nitrogen gas between each step. The clean dry substrate is then transferred to the vacuum deposition system. All organic and metal depositions may then be carried out under high vacuum ($<2 \times 10^{-6}$ Torr). Depositions are carried out by thermal evaporation from baffled Ta crucibles at a nominal deposition rate of 2–4 Å/S. First, an approximately 350 Å layer 3 of N,N'-diphenyl-N, N'-bis (3-methyphenyl)-1,1-biphenyl-4,4'-diamine (TPD) may be vapor deposited on the cleaned ITO substrate. A sample of $M(C_5Ph_5)_2$, (where M may be Ge or Pb) may then be heated to ca. 250° C., liberating $Cp^{\Phi \cdot}$, which may be deposited on top of the TPD film as layer 4. The final thickness of the $Cp^{\Phi \cdot}$ film may be about 400 Å. An array of circular 250 mm diameter 1,000 Åelectrodes 5 of approximately 10:1 Mg:Ag atomic ratio may be subsequently deposited by co-evaporation from separate Ta boats. A 500 Å thick layer 6 of Ag may be deposited to inhibit atmospheric oxidation of the electrode.

Example 2

A double heterostructure, such as shown in FIG. 2, may be fabricated by including the emissive layer 7, which may be formed as doped or un-doped tris-(8-hydroxyquinoline) aluminum $Alq_3$:

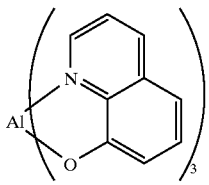

FIG. 2 shows an Alq$_3$ layer which is un-doped, thus functioning as an intermediate hole-blocking and recombination/emitting layer. The double heterostructure shown in FIG. 2 is prepared substantially as described for the single heterostructure structure, except that after depositing the TPD layer 3 and before depositing the organic free radical layer 4, layer 7, which is formed from Alq$_3$, is deposited.

The subject invention as disclosed herein may be used in conjunction with the subject matter of co-pending applications, "High Reliability, High Efficiency, Integratable Organic Light Emitting Devices and Methods of Producing Same," Attorney Docket No. 10020/1; "Novel Materials for Multicolor LED's," Attorney Docket No. 10020/2; "Multicolor Display Devices," Attorney Docket No. 10020/4; "Red-Emitting Organic Light Emitting Devices (LED's)," Attorney Docket No. 10020/5; and "High Efficiency Organic Light Emitting Device Structures," Attorney Docket No. 10020/7; each of said copending application being filed on the same date as the instant application, and being herein incorporated in their entirety by reference. The subject invention may also be used in conjunction with the subject matter of co-pending U.S. Ser. Nos. 08/354,674; 08/613,207; 08/632,316; 08/632,322; 08/693,359; 60/010,013; and 60/024,001; which are also herein incorporated in their entirety by reference.

What is claimed is:

1. A method for preparing an electron transporting layer of a multi-layer structure, wherein said multi-layer structure includes a hole transporting layer, comprising:

heating an organometallic complex under vacuum conditions to a temperature sufficient to cause the organometallic complex to form organic free radicals in the gas phase; and depositing the organic free radicals from the gas phase to form an electron transporting layer:
   (a) on a layer of emissive material, said layer of emissive material being in direct contact with the hole transporting layer of the multi-layer structure; or
   (b) on the hole transporting layer of the multi-layer structure.

2. The method according to claim 1 wherein the vacuum conditions comprise a pressure of about $10^{-5}$ to about $10^{-3}$ torr.

3. The method according to claim 1 wherein the temperature is at least about 250° C.

4. The method according to claim 1 wherein the organometallic complex is a metallocene of pentaphenylcyclopentadiene.

5. The method according to claim 1 wherein the metallocene is decaphenylgermanocene.

6. The method according to claim 1 wherein the metallocene is decaphenylplumbocene.

* * * * *

UNITED STATES PATENT AND TRADEMARK OFFICE
CERTIFICATE OF CORRECTION

PATENT NO. : 5,922,396
DATED : July 13, 1999
INVENTOR(S) : Mark E. Thompson

It is certified that error appears in the above-identified patent and that said Letters Patent is hereby corrected as shown below:

Column 2, line 16, change "Mg–Ag-ITO" to -- Mg-Ag-ITO --.

Column 2, line 18, change "Mg–Ag-ITO" to -- Mg-Ag-ITO --.

Column 9, line 9, change "layer s" to -- layers --.

Column 10, line 56, change "Åelectrodes" to -- Å electrodes --.

Signed and Sealed this

Thirtieth Day of May, 2000

*Attest:*

Q. TODD DICKINSON

*Attesting Officer*    *Director of Patents and Trademarks*